United States Patent

Hartgring et al.

Patent Number: 5,086,331
Date of Patent: Feb. 4, 1992

[54] INTEGRATED CIRCUIT COMPRISING A PROGRAMMABLE CELL

[75] Inventors: Cornelis D. Hartgring, Dublin, Ireland; Roger Cuppens, Eindhoven, Netherlands

[73] Assignee: U.S. Philips Corp., New York, N.Y.

[21] Appl. No.: 643,687

[22] Filed: Jan. 18, 1991

Related U.S. Application Data

[63] Continuation of Ser. No. 332,635, Mar. 31, 1989, abandoned.

[30] Foreign Application Priority Data

Apr. 5, 1988 [NL] Netherlands .................. 8800846

[51] Int. Cl.$^5$ .................................................. H01L 27/02
[52] U.S. Cl. ................................ 357/51; 307/219; 307/291; 307/441; 365/200; 365/210
[58] Field of Search ............... 357/51; 307/219, 291, 307/441; 365/200, 210

[56] References Cited

U.S. PATENT DOCUMENTS 4,614,881 9/1986 Yoshida et al. ................ 357/51
4,757,359 7/1988 Chiao et al. .................... 357/51

FOREIGN PATENT DOCUMENTS 55-160392 12/1980 Japan.

Primary Examiner—Jerome Jackson, Jr.
Assistant Examiner—Hung Xuan Dang
Attorney, Agent, or Firm—Steven R. Biren

[57] ABSTRACT

The invention relates to an integrated circuit having a programmable cell, more particularly for use in an electronic card. The cell is provided with a programmable element (P) having two conductive layers (51, 52), which are separated from each other by a dielectric layer (53). The element can be programmed by applying between the layers 51, 52 a programming voltage such that an electric breakdown is produced in the dielectric layer (53), as a result of which the element passes permanently from an electrically non-conducting state to an electrically conducting state. According to the invention, the programmable cell comprises an asymmetric bistable trigger circuit (I,II). The trigger circuit (I,II) is loaded with the element (P) in such a manner that during operation it is in a first state if the element is electrically non-conducting and is in a second state if the element is electrically conducting.

9 Claims, 2 Drawing Sheets

INTEGRATED CIRCUIT COMPRISING A PROGRAMMABLE CELL

This is a continuation of application Ser. No. 332,635, filed Mar. 31, 1989 now abandoned.

BACKGROUND OF THE INVENTION

The invention relates to an integrated circuit comprising a programmable cell provided with a programmable element having a first conductive layer, a second conductive layer and a dielectric layer arranged between them, while the cell can be programmed by producing in the dielectric layer an electric breakdown, as a result of which the programmable element passes permanently from an electrically non-conducting state to an electrically conducting state.

It is known to use programmable cells in electronic cards (smart cards), such as, for example, electronic credit cards. These cards are generally cards made of synthetic material, in which a semiconductor device having a storage capacitance and, as the case may be, a microprocessor is embedded. Especially in recent years, such cards have been used more and more frequenctly for, for example, electronic funds transfer and protection purposes. Coding keys and other data can be stored in the memory, which regulate reading and writing from and to the card. For safety considerations, given coding keys should be non-erasable. In fact, by erasing, the card could be brought back into a state allowing new keys and data to be programmed.

Non-erasable programmable cells are often provided with safety fuses. These safety fuses are conductor tracks, in which a restriction is locally provided. The safety fuse is programmed by conducting an electric current through the track in such a manner that the safety fuse melts at the area of the restriction or oxidizes, as, for example, in a safety fuse of silicon, as a result of which the safety fuse passes from an electrically conducting state to a non-conducting state. However, the use of such elements has a number of disadvantages. For example, the written information is visible, as a result of which it is possible to read the secret coding keys and data from the card, for example under a microscope. Moreover, safety fuses have the disadvantage that the programming currents required for melting the safety fuse are considerably larger than the usual operating currents in semiconductor devices. The supply of these large currents requires comparatively large selection transistors, which increase the volume and the cost of the device and moreover delay the access to the memory.

A circuit of the kind mentioned above is known from European Patent Application No. 213,638. This known circuit comprises a memory matrix composed of a large number of programmable cells. Each cell comprises a field effect transistor, a gate electrode of which is connected to a word line. Each cell further comprises an element of the kind mentioned in the opening paragraph, of which one of the conductive layers is connected to the transistor and the other conductive layer is connected to a bit line. The cell can be programmed by producing an electric breakdown in the dielectric layer, as a result of which the programmable element permanently passes from an electrically non-conducting state to an electrically conducting state.

Fairly complicated and voluminous additional circuits are required for reading and writing information into the known circuit and for selecting bit and word lines.

For large memories this is not an unsurmountable objection because the volume of these circuits is small as compared with the volume of the actual memory. For comparatively small memories, however, the use of the known circuit would result in that the memory would have to be provided with additional circuits, which occupy a comparatively large amount of space as compared with the actual memory. This disadvantage is even greater when a number of small memories or even individual programmable cells are distributed over the semiconductor device. Moreover, an output signal of a programmable cell often can not be directly processed in digital form in the known circuit. For this purpose, it should often first be shaped into a suitable form, which requires an additional circuit.

SUMMARY OF THE INVENTION

According to a first aspect, the invention has inter alia for its object to provide an integrated circuit comprising programmable cells, in which data can be stored, which are afterwards not or substantially not visible and cannot be erased. Thus, the circuit according to the invention is particularly suitable for use in electronic cards.

According to a second aspect, the invention has for its object to provide an integrated circuit comprising programmable cells, of which the output signal is directly suitable for digital processing and whose contents can be read and written also without additional circuits.

The invention is based inter alia on the recognition of the fact that, when programming the known cells described, conductive connections are formed in the oxide between the two conductive layers, which are not externally visible, which renders the cells particularly suitable for use in, for example, electronic cards.

According to the invention, an integrated circuit of the kind mentioned above is characterized in that the programmable cell comprises an asymmetrical bistable trigger circuit, which is loaded, such that in operation with the programmable element, the trigger circuit is in a first state if the programmable element is electrically non-conducting, and is in a second state if the programmable element is in the electrically conducting state.

Bistable trigger circuits are also often used in logic circuits. As a result, the output signal of the programmable cell in the circuit according to the invention can directly be processed in digital form in such circuits. Moreover, the manufacture of the cell according to the invention is consequently at least highly compatible with the process of manufacturing logic circuits, which are mostly integrated in the same semiconductor device. In contrast with memories provided with safety fuses, no additional circuits are required for reading and programming the circuit according to the invention. Thus, the circuit becomes particularly suitable for use in small memories and individual programmable cells. Further, the data programmed into the circuit according to the invention cannot be erased so that it is not possible to bring the device by erasing into a state which allows new data to be written. The written data are not visible so that it is not possible to read the data, which in electronic cards are often secret, from the semiconductor device under a microscope. Moreover, the user himself can program the data. This need not take place during the manufacturing process, as a result of which the possibilities of use of the device become more versatile. The cell can be programmed with usual operating currents, as a result of which the necessity of special large transistors is avoided.

BRIEF DESCRIPTION OF THE DRAWINGS

The invention will now be described more fully with reference to several embodiments and an accompanying diagrammatic drawing. In the drawing.

The Figures are schematic and not drawn to scale. For the sake of clarity, especially certain dimensions are greatly exaggerated. Corresponding parts are generally designated by the same reference numerals.

DESCRIPTION OF THE PREFERRED EMBODIMENTS

Figure 1:
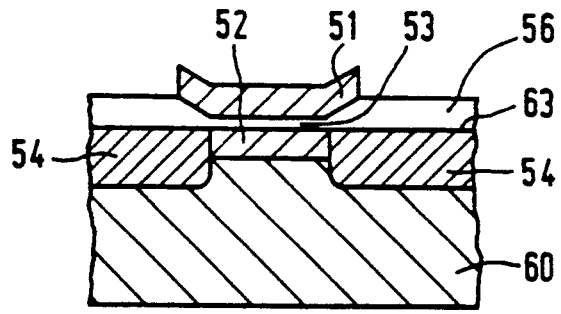
FIG. 1 shows a first embodiment of the programmable element for use in the integrated circuit according to the invention.

FIG. 1 shows a first embodiment of the programmable element from the integrated circuit according to the invention, the starting material being, for example, a p-type semiconductor substrate 60 of silicon doped with boron ions. The programmable element P comprises a first conductive layer 51, for which in this embodiment a layer of polycrystalline silicon is used, which is doped with phosphorus. The element P further comprises a second conductive layer, which is constituted in this embodiment by a comparatively weakly doped surface zone 52 disposed in the substrate 60 and having a conductivity type opposite to that of the substrate, in this case the n-type. The surface zone 52 adjoins the surface 63 of the substrate 60 and is coated at this area with a dielectric layer 53, in this embodiment an approximately 10 nm thick silicon oxide layer, which separates the surface zone 52 from the first conductive layer 51. In the unprogrammed state, both conductive layers 51 and 52 are electrically insulated from each other by the silicon oxide layer 53. In this embodiment, arsenic ions at a dose of approximately $10^{13}$ cm$^{-2}$ are implanted for forming the comparatively weakly doped surface zone 52. Although in principle a higher dose can be used for the surface zone 52, preferably a comparatively weak doping of less than approximately $10^{15}$ to $10^{16}$ cm$^{-3}$ is used at least at the area of the silicon oxide layer 53. Experiments have shown that such a comparatively weak doping has a favorable influence on the electrical properties of the silicon oxide layer 53 and hence on the programmable element. The surface zone 52 is provided with a connection, which is constituted in this embodiment by a comparatively highly doped n-type connection zone 54, which is also disposed in the substrate 60 and adjoins the surface 63 and at least locally the surface zone 52. The connection zone 54 in this embodiment comprises an arsenic in a concentration of about $10^{18}$ cm$^{-3}$. The connection zone 54 can be further contacted at the surface 63 with a suitable metallization.

The manufacture of the programmable element described above is highly compatible with a known process of manufacturing a MOS transistor. In such a process, for example, the starting material is a p-type substrate and an ion implantation is carried out (the so-called depletion implantation) to form an inversion layer adjoining the surface on behalf of a field effect transistor of the depletion type. This implantation is carried out, for example, with arsenic ions at a dose of approximately $10^{13}$ cm$^{-2}$ and can also be used to form the weakly doped surface zone 52. The substrate is thermally oxidized for forming a gate oxide layer 56 of the field effect transistor having a thickness of, for example, about 50 nm. The silicon oxide layer 56 is locally etched away at the area of the surface zone 52 for forming the dielectric layer 53 of the programmable element P, after which a second shorter thermal oxidation is carried out to grow at the area of the surface zone 52 an about 10 nm thick silicon oxide layer 53 on the substrate. Subsequently, the assembly is covered with a polycrystalline silicon layer doped with phosphorus. This doping is effected, for example, in known manner by covering the polycrystalline silicon layer with a layer of phosphor glass and by carrying out a thermal treatment. After the phosphor glass has been removed, the first conductive layer 51 of the programmable element and elsewhere a gate electrode of the field effect transistor is formed by masking and etching from the polycrystalline silicon layer. Subsequently, a second implantation is carried out, for example again with arsenic ions, but at a higher dose of approximately $10^{18}$–$10^{19}$ cm$^{-2}$, the gate electrode and the first conductive layer, respectively, masking against the implantation. At the area of the field effect transistor, n-type source and drain zones are thus formed, while at the area of the programmable element the highly doped connection zone 54 is thus formed at the area of the programmable element. Subsequently, for the field effect transistor and the programmable element together a passivation layer is provided, contact holes are etched and a contact metallization is provided.

Figure 2:
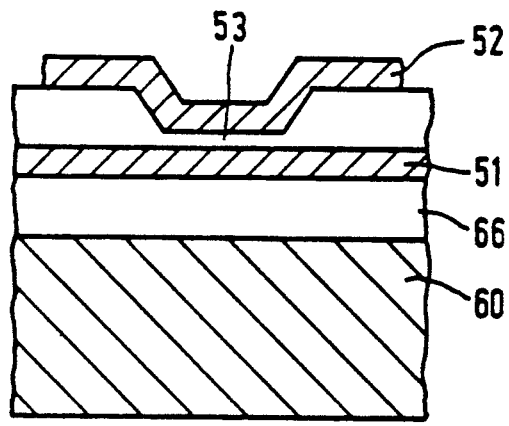
FIG. 2 shows a second embodiment of the programmable element for use in the integrated circuit according to the invention.

In FIG. 2, a second embodiment of the programmable element is shown, in which the element is arranged on a silicon oxide layer 66 disposed on the silicon substrate 60. For the first conductive layer 51, again phosphor-doped polycrystalline silicon is used. For the second conductive layer 52, the starting material is a layer of aluminum to which a small quantity (1 to 3%) of silicon may be added. Again a silicon oxide layer 53 is disposed between the two conductive layers 51, 52. The silicon oxide layer 53 may be formed, for example, by thermal oxidation of the silicon layer 51. Experiments have shown that the oxide formed from polycrystalline oxide breaks down at a lower voltage than oxide formed from monocrystalline silicon, as, for example, in the first embodiment. As a result, in this embodiment a thicker oxide layer 53, for example of 20 nm thickness, can be used without the necessity of a higher programming voltage.

The element can be programmed by applying across the dielectric layer 53 a programming voltage which is sufficient to produce in the layer 53 an electric breakdown, as a result of which a permanent electrically conducting connection is formed between the two conductive layers 51, 52. The element then permanently passes from an electrically non-conducting state to an electrically conducting state. Measurements on an about 10 nm thick dielectric layer of silicon oxide have shown that this change of state occurs when the electrical field strength in the layer exceeds about 10 MV/cm. This corresponds to a programming current of a few tens of microamperes, a programming voltage of about 15 V and a programming time of a few milliseconds. It is presumed that under these conditions in the oxide layer 53 defects are generated, which after some time result in a permanent shortcircuit between the two conductive layers of the element. Otherwise, this change of state is externally not visible.

Figure 3:
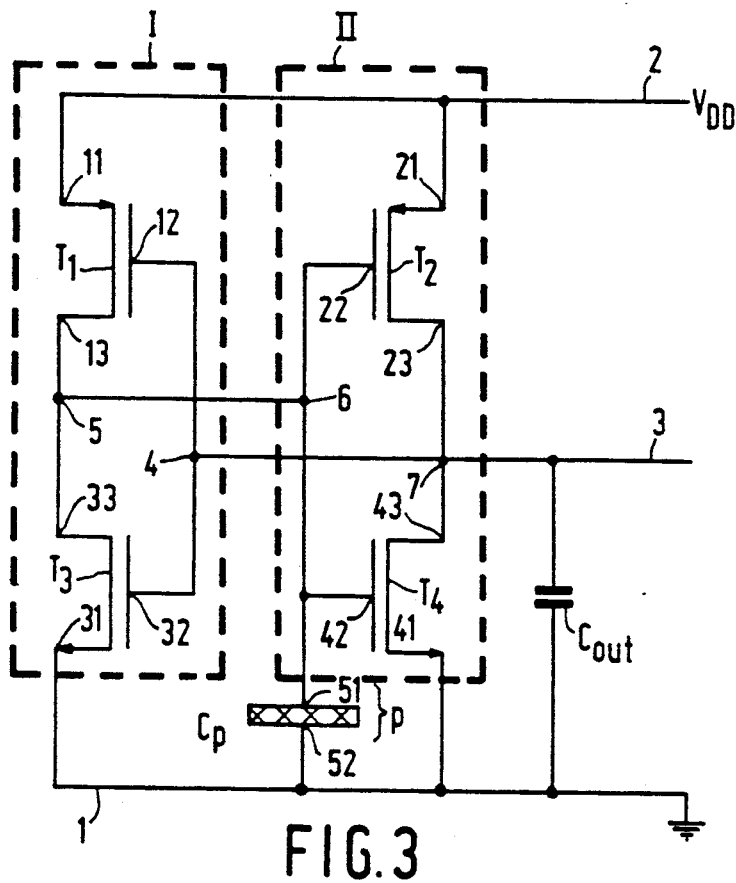
FIG. 3 shows an equivalent circuit diagram of an embodiment of the programmable cell from an integrated circuit according to the invention.

FIG. 3 shows an equivalent circuit diagram of a possible embodiment of the programmable cell with the programmable element P according to the invention. The programmable cell according to the invention comprises an asymmetrical bistable trigger circuit. In this embodiment, the trigger circuit comprises two inverter stages I, II, which are fed back and both have an input 4, 6 and an output 5, 7. Of both stages I, II, the output 5, 7 is coupled to the input 6 and 4, respectively, of the other stage. Both inverter stages I, II comprise in this embodiment a first field effect transistor $T_3$, $T_4$ and a complementary second field effect transistor $T_1$, $T_2$ connected in series therewith, which are both of the enhancement type. In this embodiment, the first transistors $T_3$, $T_4$ are of the n-channel type and the second transistors $T_1$, $T_2$ are of the p-channel type. The gate 32, 42 of the n-channel transistor $T_3$ and $T_4$, respectively, is connected to the gate 12, 22 of the p-channel transistor $T_1$ and $T_2$, respectively. The interconnected gates 12, 32 and 22, 42, respectively, constitute the inputs 4, 6 of the inverter stages I and II, respectively. The outputs 5, 7 of the inverter stages I and II, respectively, are constituted by the interconnected drains 13, 33 and 23, 43, respectively, of both transistors $T_1$ $T_3$ and $T_2$, $T_4$, respectively, in the stage. In this embodiment, the output 7 of the second inverter stage II serves as a combined input/output of the whole programmable cell and is connected to a combined read/write line 3. The source 31, 41 of the n-channel transistor $T_3$ and $T_4$, respectively, is connected to a first supply line 1; the source 11, 21 of the n-channel transistor $T_1$ and $T_2$, respectively, is connected to a second supply line 2. During operation, the first supply line 1 is connected, for example, to ground and the second supply line 2 is connected to a positive supply voltage $V_{dd}$ of about 5 V.

The trigger circuit is asymmetrical due to the fact that the two inverter stages I, II are provided with unequal capacitive loads. In this embodiment, a comparatively large output capacitance $C_{out}$ of the read/write line 3 is arranged between the output 7 of the second stage II and the first supply line 1. In the unprogrammed state, the first stage I is capacitively loaded by the programmable element P, which is connected between the output 5 of the first stage and the first supply line 1. This capacitive load is indicated in FIG. 3 by $C_p$ and is smaller than the output capacitance $C_{out}$.

If the positive supply voltage is applied between the supply lines 1, 2, the potentials of the junction points 5 and 7 will increase. The speed at which this takes place is determined for both points 5, 7 inter alia by the values of the capacitive load $C_p$ and $C_{out}$, respectively, of the junction point. Accordingly as this load is smaller, the voltage of the junction point increases more rapidly. Since the capacitive load $C_p$ of the junction point 5 is smaller than the load $C_{out}$ of the junction point 7, this means that the voltage of the junction point 5 increases more rapidly than that of the junction point 7. As a result, the voltage at the gate 22 of the p-channel transistor $T_2$ in the second inverter stage II increases more rapidly than at the gate 12 of the corresponding p-channel transistor $T_1$ in the first inverter stage I. A first state will be adjusted, in which the transistors $T_1$ and $T_4$ are both conducting and transistors $T_2$ and $T_3$ are closed. The read/write line will then assume at least substantially the said voltage of the first supply line 1.

In order to program the cell, a programming voltage of about 0–15 V is supplied to the second supply line 2. When several programmable cells are coupled to the same second supply line 2, other cells can be protected from programming by supplying beforehand to their read/write lines 3 a voltage which exceeds the threshold voltage of the trigger circuit so that the circuit passes to the opposite state, in which the transistors $T_1$ and $T_4$ are both closed and the transistors $T_2$ and $T_3$ are both conducting. If subsequently the programming voltage is applied to the second supply line 2, this voltage is not applied across the programmable elements of the protected cells.

In the programmed state, the element P is shortcircuited and it constitutes a current path between the output 5 of the first inverter stage I and a point of fixed potential, in this case ground. As a result, the gate electrodes 22, 42 of the transistors $T_2$ and $T_4$, respectively, are permanently connected to ground. When the positive supply voltage is applied to the second supply line, the p-channel transistor $T_2$ will remain conducting and the n-channel transistor $T_4$ remains closed. The voltage at the junction point 7 will assume the value of the positive supply voltage. A second state is adjusted, in which the transistors $T_1$ and $T_4$ are both closed and the transistors $T_2$ and $T_3$ are both conducting. If the cell is programmed, the input/output 3 will therefore assume a high voltage. It should be noted that both in the programmed and in the unprogrammed state the cell does not or substantially not consume current due to the fact that always in both inverter stages I and II at least one of the transistors is non-conducting. The programmable cell of FIG. 3 can be integrated in a semiconductor substrate 60 of, for example, monocrystalline silicon.

Figure 4:
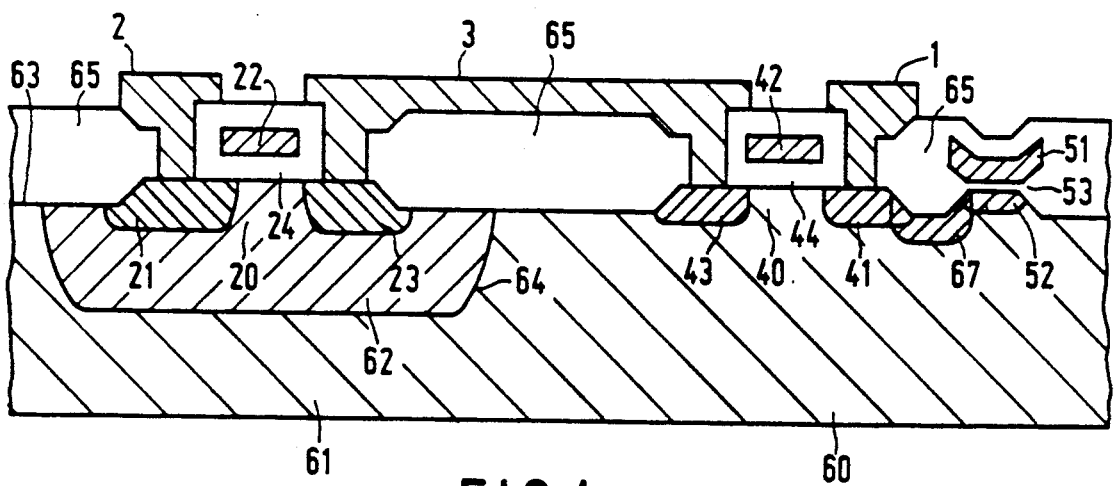
FIG. 4 shows a cross-section of an embodiment of the programmable cell of FIG. 3 integrated in a semiconductor substrate.

FIG. 4 shows a possible embodiment thereof in cross-section. For the sake of clartiy, only the inverter stage II with the programmable element P is shown; the remaining part of the circuit can be integrated in an analogous manner. The semiconductor body 60 comprises a weakly doped p-type first region 61 and an n-type second region 62, which adjoins the surface 63, is also weakly doped and is entirely enclosed by the first region 61 and forms with it a pn junction 64. The first region 61 accommodates the n-channel transistor $T_4$ of the enhancement type and the programmable element P. The complementary p-channel field effect transistor $T_2$ of the enhancement type is provided in the second region 62. The various components are mutually separated by a comparatively thick layer of field oxide 65.

The n-channel transistor $T_4$ comprises n-type source and drain zones 41, 43 with an interposed p-type channel region 40. The transistor further comprises a gate electrode 42 of polycrystalline silicon, to which phosphorus is added. The gate electrode 42 is separated from the channel region 40 by an about 50 nm thick layer of silicon oxide 44, the so-called gate oxide layer.

The p-channel transistor $T_2$ is provided in the second region 62 of the substrate 60 and comprises p-type source and drain zones 21, 23, between which a channel region 20 is arranged. Above the channel region 20, the gate electrode 22 is disposed, which is separated from the substrate by an about 50 nm thick silicon oxide layer 24. Like in the n-channel transistor $T_4$, the gate electrode 22 comprises phosphorus-doped polycrystalline silicon.

The programmable element comprises a first conductive layer 51 of polycrystalline silicon, which is doped with phosphorus. The first conductive layer 51 may be provided, for example, simultaneously with the gate electrodes 22, 42 of the transistors. The second conductive layer is constituted in this embodiment by a surface zone 52 in the semiconductor substrate 60 weakly doped with arsenic. The dielectric layer 53, which separates the two conductive layers 51, 52, in this embodiment comprises an about 10 nm thick silicon oxide layer 53. The silicon oxide layer 53 may be formed, for example, by thermal oxidation of the substrate 60.

Outside the cross-sectional surface, the gate electrodes 22 and 42 of the transistors $T_2$ and $T_4$ and the first conductive layer 51 of the programmable element P are interconnected. For this purpose, use may also be made of phosphorus-doped polycrystalline silicon so that the gate electrodes, the first conductive layer and the interconnection can be provided in a single deposition and etching step. The two drain zones 23, 43 are coupled to each other by means of the read/write line 3. In this embodiment, the read/write line 3 comprises aluminum, to which a small quantity of silicon is added. The same material may also be used for the first supply line 1 and the second supply line 2, which are connected to the source 41 of the n-channel transistor $T_4$ and to the source zone 31 of the p-channel transistor $T_3$, respectively. During operation of the device, the first supply line 1 is connected to ground, GND, while the second supply line is connected to the positive supply voltage $V_{dd}$. The surface zone 52 of the programmable element P adjoins a comparatively highly doped n-type connection zone 67, which is located below the field oxide 65 and constitutes an electrical connection for the surface zone 52 and is connected to the source zone 41 of the n-channel transistor $T_4$. The connection zone 67 may be provided, for example, by introducing, before the field oxide 65 is formed, a suitable dopant into a surface region of the substrate 60, for example by an implantation of arsenic at a dose of about $10^{18}$ cm$^{-2}$. With a subsequent local thermal oxidation of the substrate 60, in which the field oxide 65 is formed, the dopant diffuses into the silicon so that a further zone 67 is obtained below the field oxide 65 in the substrate 60.

It should further be noted that the inverter stage in the bistable trigger circuit described above is given only by way of example. However, many further variations are possible within the scope of the invention for those skilled in the art. For example, in the embodiment described, all conductivity types may be interchanged. The inverter stage may also be provided with an inverting field effect transistor, whose drain is connected via a resistor to one of the supply lines. It is possible to use for the resistor a field effect transistor of the depletion type, whose gate electrode is shortcircuited with the source. In many known processes of manufacturing semiconductor devices, processing steps are effected for realizing such a transistor.

Instead of in a bistable trigger circuit comprising field effect transistors, the programmable element according to the invention may also be used in a trigger circuit comprising bipolar transistors, of the NPN and/or of the PNP type.

The programmable element may be provided between the output of the first inverter stage and the first supply line or at other areas in the cell, for example between the output of the second inverter stage and the second supply line.

In the embodiment described above, the trigger circuit is asymmetrical due to an unequal capacitive load of the inverter stages of which the trigger circuit is composed. Such an asymmetry may be obtained in numerous other ways, however. For example, the dimensions of the transistors present in both stages may be chosen to be different from each other. It is also possible to load the two stages with unequal resistances in such a manner that the desired asymmetry is attained.

For the dielectric layer, insulating materials other than silicon oxide may be used, such as, for example, silicon nitride and aluminum oxide. It is moreover possible to use, instead of a uniform layer, a layer structure composed of layers of different materials.

For the materials of the conductive layers in the programmable element, other materials usual in the semiconductor technology may be employed.

Moreover, for the substrate also other semiconductor materials may be used, such as, for example, germanium, GaAs and AlGaAs.

We claim:

1. An integrated circuit comprising a programmable cell provided with a programmable element having a first conductive layer, a second conductive layer and a dielectric layer arranged between them, the cell being programmed by producing an electric breakdown in the dielectric layer, as a result of which the programmable element passes permanently from the electrically non-conducting capacitive state to an electrically conducting state, the programmable cell comprising an asymmetrical bistable trigger circuit, capacitance means for initially setting said trigger circuit to a first state in operation and comprising said programmable element being in said non-conducting capacitance state, and conductive means for subsequently permanently setting said trigger circuit to a second state in operation and comprising said programmable element being in the permanent electrically conducting state.

2. An integrated circuit as claimed in claim 1, characterized in that the bistable trigger circuit comprises two fed-back inverter stages, both having an input and an output with the output of each stage being coupled to the input of the other stage, the programmable element being connected to the output of one of the inverter stages and constituting in the programmed state, a current path between this output and a point of fixed potential.

3. An integrated circuit as claimed in claim 2, characterized in that the trigger circuit is made asymmetrical by the inverter stages each being provided with a capacitive load having a different value.

4. An integrated circuit as claimed in claim 2, characterized in that a comparatively large output capacitance is disposed between the output of one of the inverter stages and a supply line and in that the programmable element is connected between the output of the other inverter stage and the supply line, the element constituting, in the unprogrammed state, a capacitive load which is smaller than said output capacitance.

5. An integrated circuit as claimed in claim 2, characterized in that the inverter stage comprises an enhancement type field effect transistor, of which a gate constitutes the input of the stage, of which a drain is connected through a load to a supply line and constituted the output of the stage and of which a source is coupled to another supply line.

6. An integrated circuit as claimed in claim 2, characterized in that the inverter stage comprises a first field effect transistor and a complementary second field effect transistor of the enhancement type connected in series therewith, which are both provided with a source, a drain and a gate, the gates being interconnected and constituting the input of the stage, the drains being interconnected and constituting the output of the stage and the sources each being coupled to a supply line.

7. An integrated circuit as claimed in claim 1, characterized in that the dielectric layer is a silicon oxide layer, which has at least at the area of the conductive layers a thickness of about 5-30 nm.

8. An integrated circuit as claimed in claim 1, characterized in that one of the conductive layers of the programmable element comprises a comparatively weakly doped surface zone of a second conductivity type, which is disposed in the semiconductor body of a first conductivity type, on which the dielectric layer is provided and which adjoins at least in part a comparatively highly doped zone of the second conductivity type, which is also disposed in the semiconductor body and forms at least part of an electrical connection of the surface zone.

9. An electronic card provided with the integrated circuit claimed in claim 1.

* * * * *